United States Patent [19]

Walton et al.

[11] Patent Number: 4,911,653
[45] Date of Patent: Mar. 27, 1990

[54] ROTATION LOCK AND WIPE CONNECTOR

[75] Inventors: Alfred C. Walton, Redwood City; John F. Krumme, Woodside, both of Calif.

[73] Assignee: Beta Phase, Inc., Menlo Park, Calif.

[21] Appl. No.: 397,234

[22] Filed: Aug. 23, 1989

[51] Int. Cl.[4] ............................................. H01R 13/62
[52] U.S. Cl. .................................. 439/326; 439/493; 439/630
[58] Field of Search ................. 439/59, 62, 67, 65, 439/260, 267, 325, 326, 327, 328, 329, 493, 629, 630

[56] References Cited

U.S. PATENT DOCUMENTS 3,102,767  9/1963  Schneck ............................ 439/493
3,319,216  5/1967  McCullough ..................... 439/493
3,401,369  9/1968  Palmateer et al. ................ 439/62
4,826,446  5/1989  Juntwait .......................... 439/326

Primary Examiner—Neil Abrams
Assistant Examiner—Khiem Nguyen
Attorney, Agent, or Firm—Burns, Doane, Swecker & Mathis

[57] ABSTRACT

A rotation lock and wipe connector having a biasing member which is generally C-shaped and flexible circuitry containing a plurality of electrical contacts mounted about the biasing member, insertion and rotation of a circuit board within the biasing member mechanically and electrically interconnecting the circuit board with the electrical contacts of the flexible circuitry and simultaneously generating a wiping action between the contacts and the circuit board inserted therein is disclosed.

18 Claims, 5 Drawing Sheets

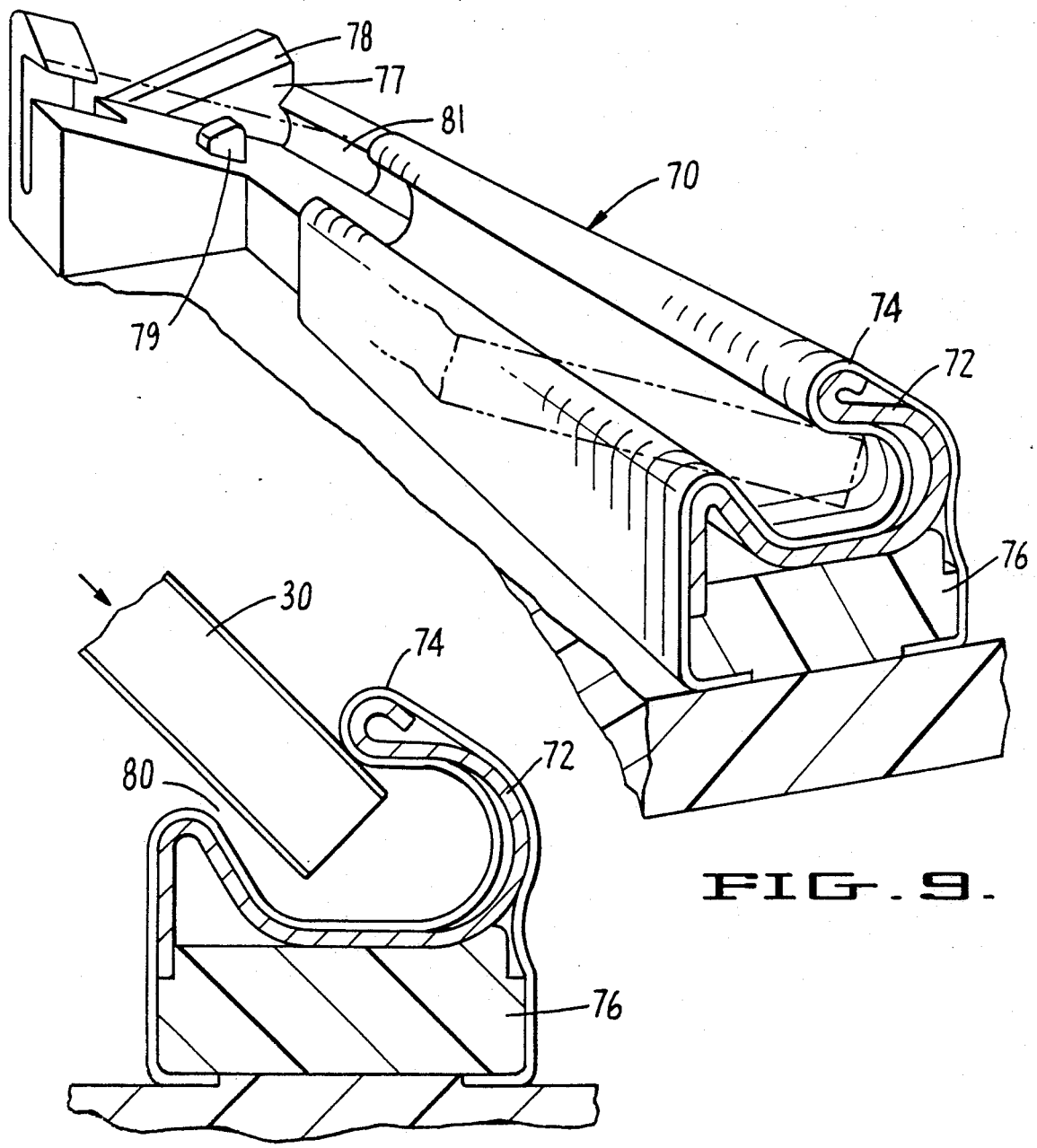
FIG.9.
FIG.10.
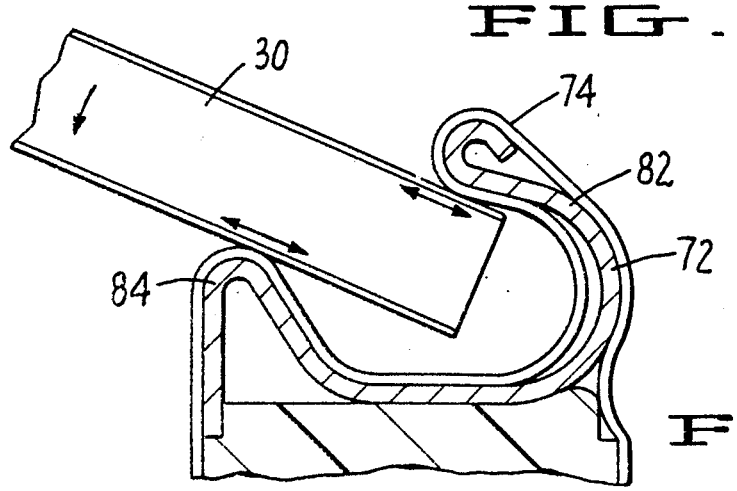
FIG.11.

ROTATION LOCK AND WIPE CONNECTOR

BACKGROUND OF THE INVENTION

1. Field of the Invention

The invention relates to high-density electrical connectors, specifically zero- or low-insertion-force connectors.

2. Prior Art

Interconnection of semi-conductor devices such as integrated circuits is increasingly difficult as the number of contacts increases. The greater the number of contacts, the more critical the alignment and cleanliness of the contacting surfaces.

In order to provide a removable connection, it is commonly known to insert a circuit board into connectors having spring-loaded retaining sockets. As the number of contacts increases, the amount of force required to overcome the cumulative resistance of the corresponding number of sockets becomes so great that the risk of damage to either the connector or the circuit board becomes far more likely.

It is also known to have connectors having a plurality of offset individual sockets in which a circuit board may be inserted and rotated into a connected position. Unfortunately, the plurality of individual contacts limits the number of electrical connections and presents significant alignment problems.

To overcome problems of alignment and insertion force, electrical connectors have been developed which use mechanical actuation to close (or open) contacts and to maintain a mechanical retaining force. Such devices are generally complex and bulky. More sophisticated actuation mechanisms using shape-memory alloy actuators have also been developed in which remote actuation of the connector is desirable.

Unfortunately, none of the above-discussed connectors provides a simple, manually operated, low- insertion-force, high-density, in-line connector with independent two-sided contact and a contact wiping mechanism.

SUMMARY OF THE INVENTION

The purpose of the invention is to provide a high-density electrical connector that is manually actuated by insertion motion of a circuit board or the like, the connector providing alignment wiping and mating of electrical contacts without requiring excessive insertion force. To accomplish this purpose there is provided a rotation lock and wipe connector having a biasing member which is generally C-shaped and having flexible circuitry including a plurality of electrical contacts, the flexible circuitry being mounted about the biasing member, rotation of a circuit board after insertion within the biasing member mechanically and electrically interconnecting the circuit board on both sides with the contacts while simultaneously creating a wiping action between the contacts and the circuit board.

In one aspect of the invention there is provided a rotation lock and wipe connector comprising:

a biasing member, said biasing member being elongated and having a longitudinal opening along the length thereof, the biasing member being generally C-shaped having a center portion and arm portions terminating in said opening, said opening being sufficiently wide to allow the insertion of a circuit board at a first angle with little effort, rotation of such a circuit board with respect to said opening to a second angle changing the effective width of said opening with respect to a circuit board; and flexible circuitry having first and second sets of parallel-spaced electrical conductors, at least a portion of said flexible circuitry mounted about said biasing member, said conductors being oriented generally perpendicular to said opening, said electrical conductors terminating in first and second sets of electrical contacts, said first set of contacts positioned on one side of said opening and said second set of contacts positioned on the other side of said opening, rotation o a circuit board within said opening interconnecting such a circuit board with said electrical contacts and bending at least one of said arm portions of said biasing member, movement of said arm members causing a wiping action between said electrical contacts and the circuit board inserted within said opening while simultaneously creating a normal force on said electrical contacts thus ensuring electrical integrity.

DESCRIPTION OF THE DRAWING

FIG. 9 is a partial perspective view similar to FIGS. 1 and 5 of yet another embodiment of a connector according to the invention connected with a portion of the circuit board shown in phantom line;

FIG. 10 is an end view of the connector of FIG. 9 with a circuit board being initially inserted therein;

FIG. 11 is an end view corresponding to FIG. 10 wherein the circuit board has been rotated from the position shown in FIG. 10 to a locked and connected position;

DESCRIPTION OF THE PREFERRED EMBODIMENTS

Figure 1:
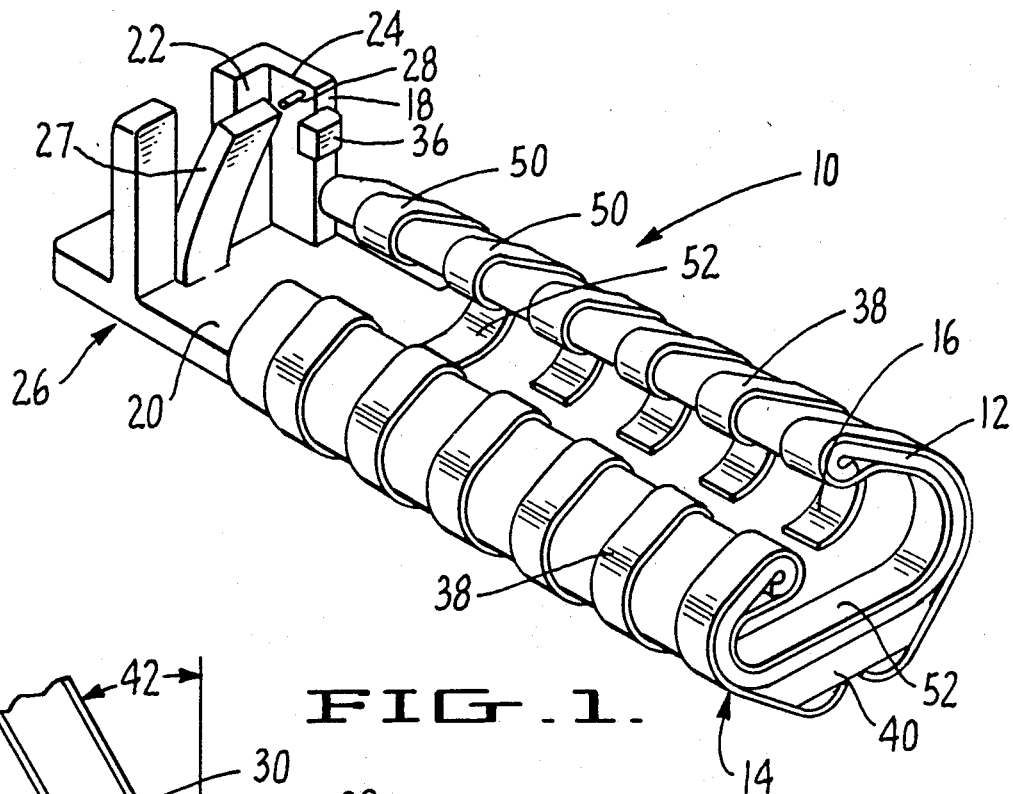
FIG. 1 is a perspective view of an embodiment of the connector of the invention.
Figure 2:
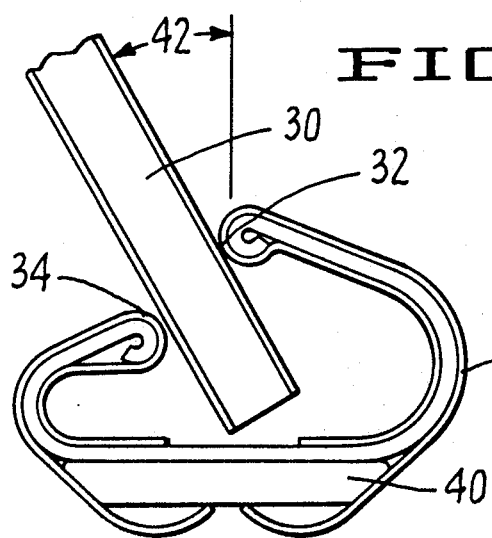
FIG. 2 is an end view of the connector of FIG. 1 wherein a circuit board is being initially inserted therein.
Figure 3:
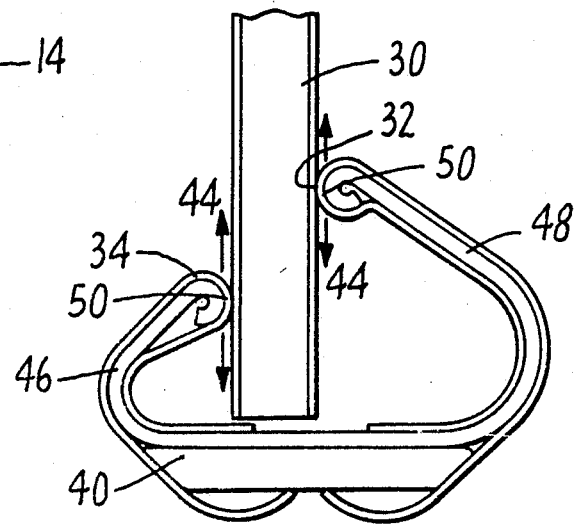
FIG. 3 is an end view corresponding to FIG. 2 wherein the circuit board has been rotated from the position shown in FIG. 2 to a locked and firmly connected position.

With continued reference to the drawing, FIG. 1 illustrates a rotation lock and wipe connector, shown generally at 10, having a biasing member 12 and flexible circuitry shown generally at 14. The biasing member 12 is elongated in shape and has a longitudinal opening 16 along the length thereof. A circuit board, for example, a daughter board (not shown in FIG. 1), may be inserted into the longitudinal opening 16, as can be seen in FIG. 2, and rotated to a connected and locked position, as seen in FIG. 3.

Connector 10 also includes a releasable lock means shown generally at 26 which will secure a circuit board in a vertical connected position, as will be discussed further. The connector thus provides the ability to insert a circuit board with little or no insertion force, subsequent rotation of the circuit board interconnecting the circuit board to the connector on both sides of the circuit board. As will be discussed further, the connector also provides the potential for high line density contact through the use of flexible circuitry including integral ground planes (if desired), the flexible circuitry of the connector accommodating surface or leaded mounting of the connector.

FIG. 1 illustrates the connector 10 having a biasing member 12 including lock means 26 operatively connected to the biasing member. Lock means 26 is shown to be integral with the biasing member 12. It is understood that lock means 26 may be a separate component. The base 20 and other components of the lock means 26 may be constructed from the same material as the biasing member 12 (which is preferably a springy material such as beryllium copper or from other materials which may be electrically conductive or non-conductive). Lock means 26 includes an end member 22, a side member 24 and a movable member 27. Side member 24 may also include a pin 28 or the like to locate a circuit board that will be secured by the lock means 26. As seen in FIGS. 2 and 3, a circuit board 30 comprising a printed circuit board or the like having a plurality of parallel-spaced electrical contacting surfaces 32 and 34 on the surface thereof may be secured and fastened within the connector 10. With reference to FIG. 1, the circuit board 30 (not shown) may be inserted into the longitudinal opening 16 by pushing the movable member 27 longitudinally to straighten the movable member 27. Upon rotation of the circuit board 30, the movable member 27 will be free to spring back outside the circuit board 30, thus trapping the circuit board 30 between the movable member 27 and the side member 24. Side member 24 includes pin 18 and registration member 36 which will engage the circuit board 30, such as in corresponding holes in the circuit board, to position and align the circuit board within the connector. End member 22 abuts the end of circuit board 30 (providing gross alignment) and prevents further movement of the circuit board. Although a particular lock means is shown, it is within the scope of the invention to provide other similar mechanical mechanisms that will allow the rotation of the circuit board 30 relative to the connector and which will secure and align the circuit board 30 in its electrically interconnected position.

Connector 10 includes flexible circuitry 14 mounted about the biasing member 12. The flexible circuitry 14 includes first and second sets of electrical conductors 38 comprising the surface of the flexible circuitry. It is within the scope of the invention to also use other forms of flexible circuitry, e.g., co-planar with micro-strip flexible circuitry and co-planar with ground plane flexible circuitry. It is also within the scope of the invention to terminate the electrical conductors for interconnection purposes in matrices of contacts (as will be described later in more detail). In FIGS. 1-3, the flexible circuitry wraps from and around the outside of the connector 10 into the longitudinal opening 16 defining electrical contacts 50 on the inside surfaces of the flexible circuitry on opposite sides of the longitudinal opening 16. As seen in those figures, a resilient pad 40 or the like is positioned between the flexible circuitry and the center portion of the biasing member 12 to maintain pressure on the flexible circuitry while it is surface mounted to a circuit board (not shown) below the connector 10. Resilient pad 40 may be one piece, as shown, or may comprise separate strips of material positioned, as previously described. Although resilient pads are shown to maintain pressure on the flexible circuitry, it is within the scope of the invention to provide pressure by other means such as by the springiness of the flexible circuitry itself. Again, various types of flexible circuitry may be used with the invention. Such circuitry is described in commonly-assigned U.S. patent application Ser. No. 07/255,500 which is incorporated herein by reference. It is understood that the use of flexible circuitry allows a high density of very fine-lined conductors. It is understood that since the connector will contact both sides of the circuit board, the flexible circuitry doubles the number of contacts that can be made with a circuit board. The individual electrical conductors 38 of the flexible circuitry may optionally be continuous (such as in the continuous two-sided conductor 52) thus allowing an electrical circuit to be made with both sides of the circuit board. Various combinations of continuous and discontinuous conductors which will allow two-sided connection to a circuit board are within the scope of the invention.

Figure 4:
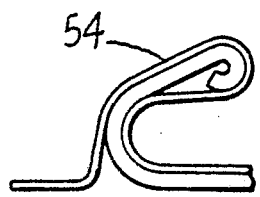
FIG. 4 is an end view similar to FIG. 3 of an alternate embodiment of the connector wherein the flexible circuitry is led away from the connector.

FIGS. 1-3 disclose a connector capable of being surface mounted to a surface beneath the connector, e.g., a mother board. FIG. 4 illustrates an optional embodiment wherein the flexible circuitry 54 is led away from the connector for termination purposes. It is understood that various combinations of remote and proximate termination of the flexible circuitry, as is known in the art, are within the scope of the connector of the invention.

As seen in FIGS. 2 and 3, the circuit board 30 is rotated through an angle between its insertion position and its final locked position. Although the angle 42 is shown to be approximately 30°, it is understood that it is within the scope of the invention to have other degrees of rotation which will change the degree of contact with the flexible circuitry of the connector. As seen by direction arrows 44 in FIG. 3, rotation of the circuit board 30 not only causes forces to be created by the biasing member and the flexible circuitry normal to the surface of the circuit board 30, but also causes a wiping motion of the flexible circuitry contacts relative to the circuit board 30 by the bending of the arm portions 46 and 48 of the generally C-shaped biasing member. The relative movement between the flexible circuitry and said circuit board removes oxides and other contaminants that may have built up on the surface of the flexible circuitry contacts and/or the circuit board, thereby enhancing the electrical contact therebetween.

Figure 5:
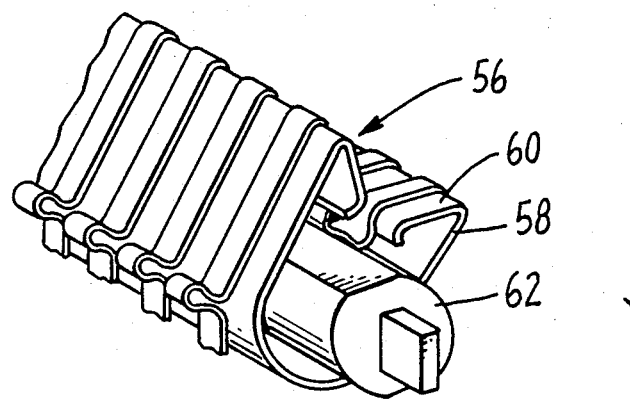
FIG. 5 is a partial exploded perspective view similar to FIG. 1 of an alternate embodiment of a connector according to the invention using a fixed cam means to assist in the opening of the connector.
Figure 6:
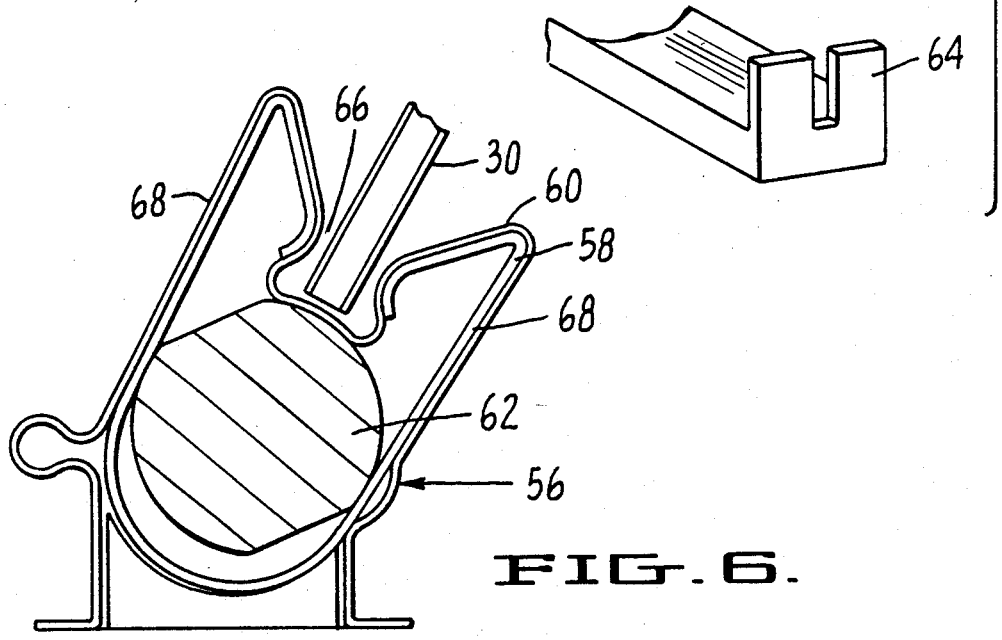
FIG. 6 is an end view of the embodiment shown in FIG. 5 with the connector in an open position.
Figure 7:
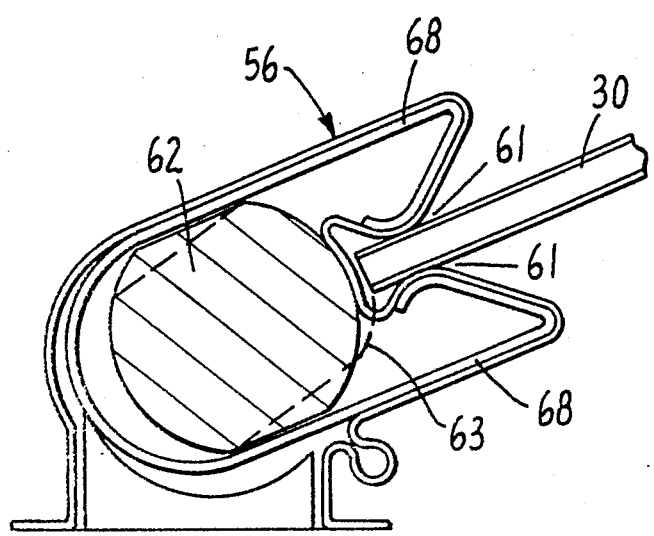
FIG. 7 is an end view similar to FIG. 6 of the connector in the closed position.

FIG. 5 is a partial exploded perspective view of an alternate embodiment of a connector shown generally at 56 having alternate biasing member 58 and alternate flexible circuitry 60 and further including cam means 62 positioned within alternate biasing member 58. Cam means 62 is held in angular position against rotation by frame 64. As seen in FIGS. 6 and 7, rotation of the alternate biasing member 58 about the surface of cam means 62 changes the dimension of connector opening 66. In FIG. 6 a circuit board 30 is inserted in the connector opening 66. Cam means 62 forces the arm portions 68 away from each other.

In FIG. 7, the connector 56 has been rotated relative to cam means 62 such that the lobes of the cam means 62 no longer hold out the arm portions 68 of the alternate biasing member 58.

While it has been seen that the progressive deformation of the alternate biasing member 58 causes wiping to occur in the contact zone, an additional profile 63 (shown in phantom line) or the like may be included in the cam to deliberately translate the printed circuit board 30 in the contacting zone 61 after the arm portions 68 have moved to ensure a prescribed wiping action.

Figure 8:
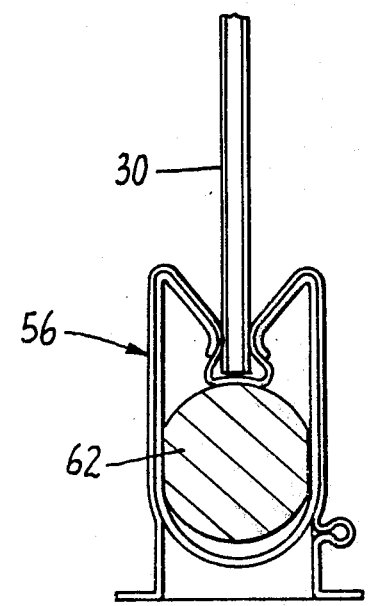
FIG. 8 is another alternate embodiment of the connector shown in FIGS. 5-7 wherein the cam member is fixed at an angle different from the angle of the connector in FIGS. 5-7 to close the connector in a perpendicular position.

It is understood that cam means 62 can be mounted relative to frame 64 at angular orientations other than those shown in FIGS. 5-7. In FIG. 8 cam means 62 is mounted such that the connector 56 is closed relative to circuit board 30 when the circuit board is in a vertical orientation.

FIGS. 9-11 illustrate yet another embodiment of the invention. A low-profile connector shown generally at 70, includes low-profile biasing means 72 and flexible circuitry 74. Low-profile biasing means 72 and flexible circuitry 74 are mounted about longitudinal base 76. Lock means 78 with releasable locking clip 78a, similar to that shown in FIG. 1, is operatively connected to longitudinal base 76.

As seen in FIGS. 10 and 11, a circuit board 30 may be inserted within opening 80 and rotated, as in the other embodiments, to electrically and mechanically interconnect circuit board 30 with the low-profile connector 70. It can be seen that rotation of circuit board 30 causes modified arm 82 of low-profile biasing means 72 to bend outwardly, the bending of modified arm 82 and the ensuing pivoting about arm portion 84 thus creating a wiping action to clean the contacts on the circuit board 30.

Figure 12:
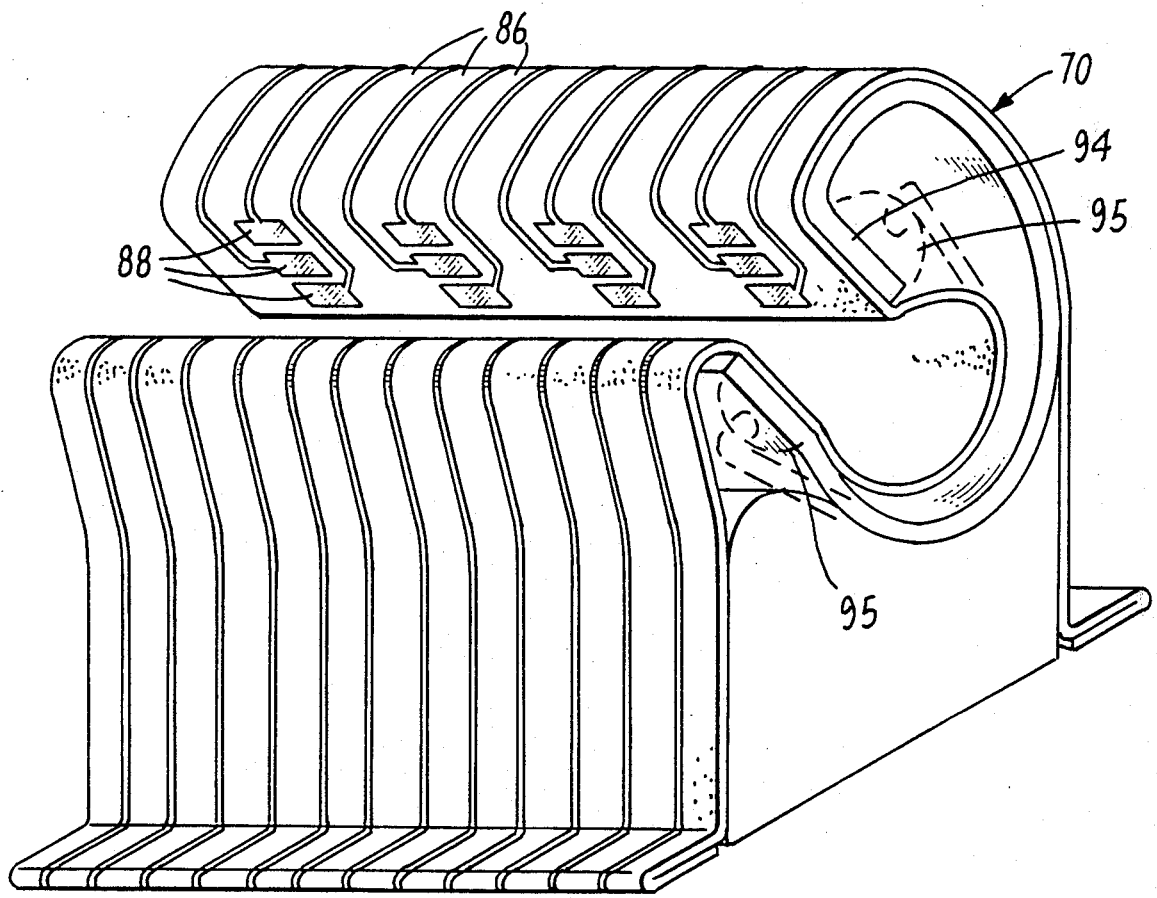
FIG. 12 is a perspective view of an alternate embodiment wherein the electrical conductor terminates in a matrix of electrical contacts within the opening of the connector.

FIG. 12 shows a perspective view of a variation in which the electrical traces 86 terminate in a matrix of contact pads 88 in the opening of the connector 90. As the rows in this matrix are added, the contact density of the connector doubles, triples, etc. Note that to mate contacts in a two-dimensional area, rather than a more conventional one-dimensional line, the spring 92 must have carefully tailored surfaces at its ends 94 which deflect during mating, along with the main "U", in order that appropriate norm forces are generated for the individual contact pads across the matrix.

An alternative spring 92 could include floating "pressure blocks" 95 (shown in phantom line) located on the ends of the biasing member. This mechanism allows the force to be distributed evenly over an entire area, rather than distributing the force over the line necessary for a pair of single row connections.

Figure 13:
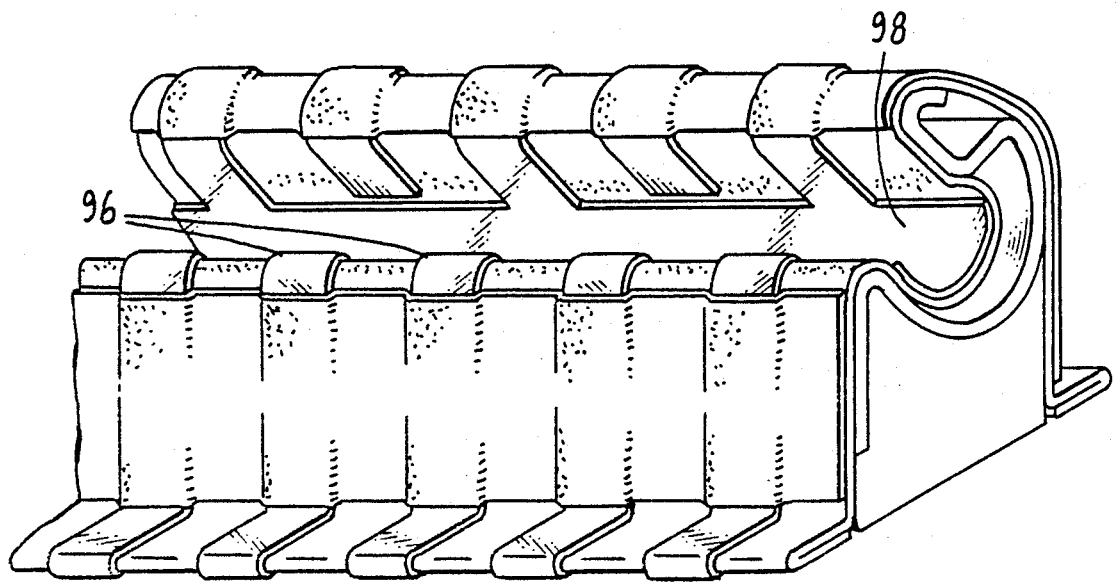
FIG. 13 is a perspective view of another alternate embodiment wherein the electrical conductors are co-planar.
Figure 14:
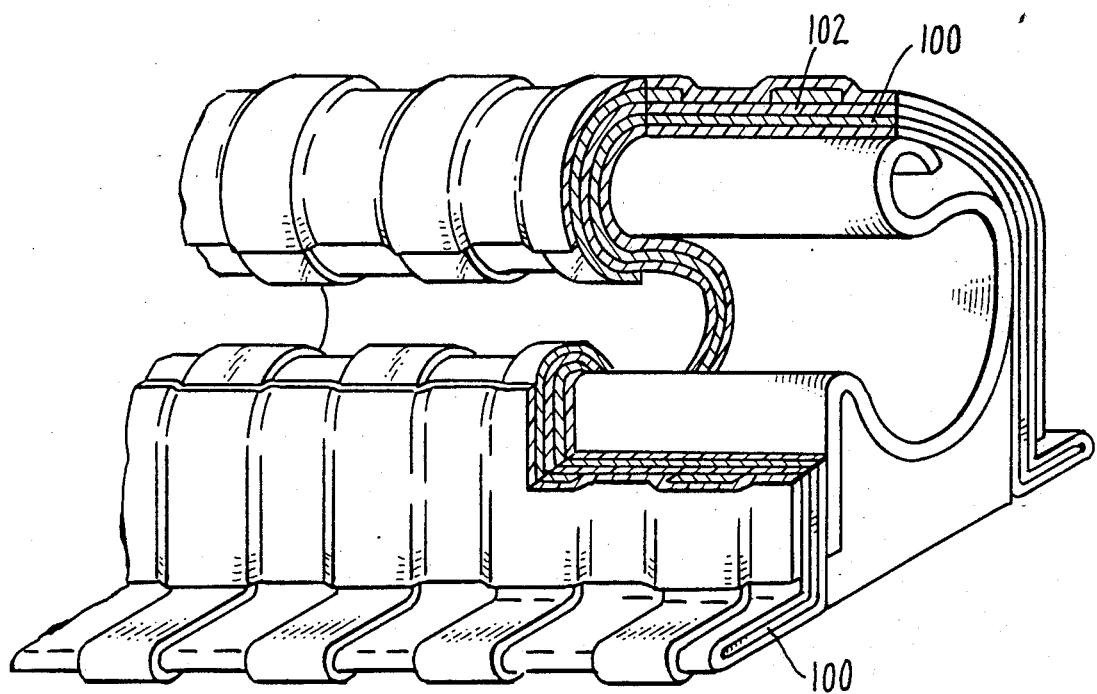
FIG. 14 is a perspective view of yet another alternate embodiment wherein the electrical conductors include a ground plane defining micro-strip flexible circuitry.
Figure 15:
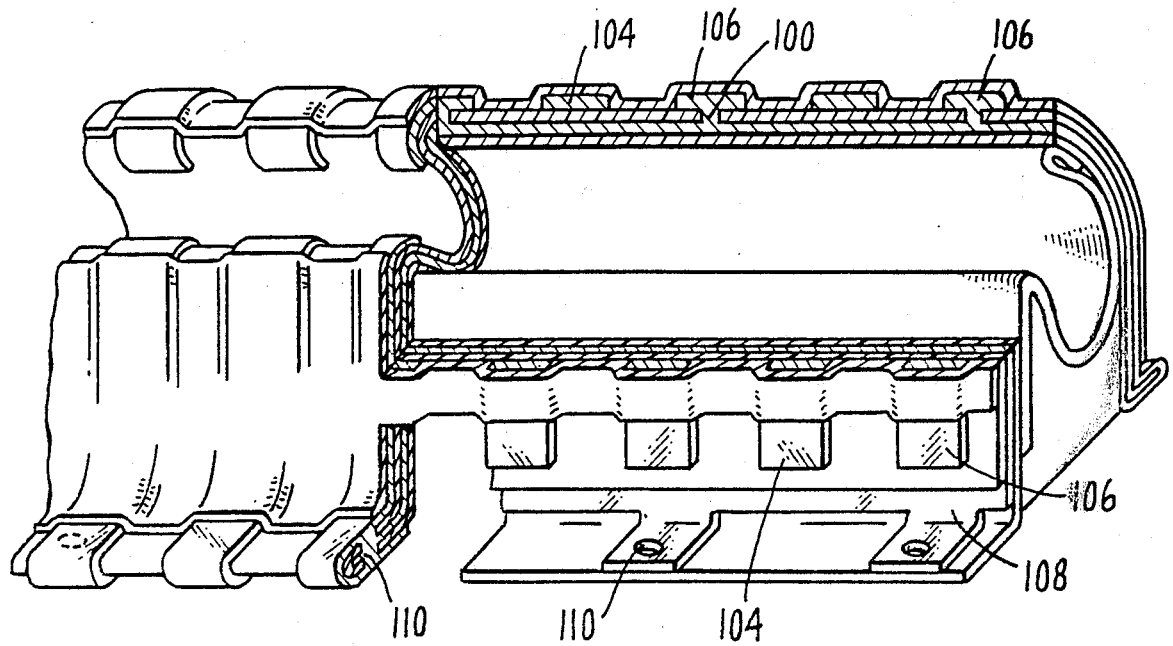
FIG. 15 is a perspective view of still another alternate embodiment wherein the electrical conductors include a ground plane and wherein said electrical conductors are alternately grounded to said ground plane defining co-planar with ground plane flexible circuitry.

FIGS. 13, 14, and 15 show alternate embodiments which minimize the disturbances to the signal integrity that electronic connectors have traditionally introduced in high-frequency applications. They all rely upon introducing a controlled impedance to a ground plane from the signal traces, thus keeping the respective fields more consistent.

FIG. 13 is a perspective view of an alternate embodiment utilizing "co-planar" construction of the flexible circuitry. Alternate traces 96 are tied common-to-ground, here shown in a common bus 98 located on the flexible circuitry in the opening of the connector, but which may be accomplished elsewhere in the connector or on the printed wiring board onto which the connector is mounted or mated (mother or daughter board).

FIG. 14 is a perspective view of an alternate embodiment utilizing "micro-strip" construction of the flexible circuitry wherein the ground plane is accomplished by an additional conductive layer 100 introduced on the flexible circuitry. This layer is insulated from the signal traces 102 and would typically be tied to ground with a via (plated-through hole) to a grounded trace at some point in the connector (not shown).

FIG. 15 shows a perspective view of an alternate embodiment utilizing a combination of "micro-strip" and "co-planar" flexible circuitry constructions. Signal traces 104 alternate with grounded traces 106 which are both separated by a thin dielectric layer from a second conductive layer on the flexible circuitry of the connector which is the largely unetched ground plane 108. The ground plane layer is tied common to the grounded traces, an they, in turn, to each other, through the use of conventional plated through hole vias 110, located in some location (or locations) on each of these grounded traces.

A further embodiment (not shown) would be using "strip-line" flexible circuitry. This employs a design with three dielectrically separated conductive layers, the outer two of which are largely undisturbed ground planes which sandwich the etched trace layer. The traces surface in windows, either in rows or matrices, in the ground sheets, the center of each having the respective contact and mating to corresponding pads on a circuit board or connector header.

The connector provides alignment for the circuit board in a multitude of ways: grossly, through the use of an edge stopping feature 77 and precisely through the use of conical registration features 79, both features 77 and 79 located on the base 76 of the connector and the latter of which (conical registration feature 79) would correspond to drilled holes on the printed circuit card (no shown). In addition, the connector provides a wiping action for the contacts by means of relative motion between the circuit board and portions of the connector upon rotation of the circuit board. A wiping action may be forced by providing a convex cylindrical surface 81 which defines the center of rotation of the mating circuit board and thus promotes a defined wiping action.

While the invention has been particularly shown and described with reference to the preferred embodiments thereof, it will be understood by those skilled in the art that the foregoing and other changes in form and details may be made therein without departing from the spirit and scope of the invention, the invention being limited only by a just interpretation of the following claims.

What is claimed is:

1. A rotation lock and wipe connector comprising:
a biasing member, said biasing member being elongated and having a longitudinal opening along the length thereof, the biasing member being generally C-shaped having a center portion and arm portions terminating in said opening, said opening being sufficiently wide to allow the insertion of a circuit board at a first angle with little effort, rotation of such a circuit board with respect to said opening to a second angle changing the effective width of said opening with respect to a circuit board; and
flexible circuitry having first and second sets of parallel-spaced electrical conductors, at least a portion of said flexible circuitry mounted about said biasing member, said conductors being oriented generally perpendicular to said opening, said electrical conductors terminating in first and second sets of electrical contacts, said first set of contacts positioned on one side of said opening and said second set of contacts positioned on the other side of said opening, rotation of a circuit board within said opening interconnecting such a circuit board with said electrical contacts and bending at least one of said arm portions of said biasing member, movement of said arm members causing a wiping action between said electrical contacts and the circuit board inserted within said opening while simultaneously creating a normal force on said electrical contacts thus ensuring electrical integrity.

2. A connector as in claim 1 including a lock means operatively connected to said biasing member to maintain a circuit board in position after rotation of a circuit board within said opening.

3. A connector as in claim 2 wherein the arm portions of said biasing member are uneven in length, said center portion of said biasing member being generally planar, said arm portions defining an opening for the insertion of a circuit board therebetween, rotation of such a circuit board generally perpendicular to the plane of said center portion bending said arm portions.

4. A connector as in claim 3 wherein said electrical conductors of said flexible circuitry terminate outside and adjacent said generally planar center portion of said biasing member, said connector thereby being surface-mountable.

5. A connector as in claim 4 further including resilient means between said planar center portion of said biasing means and the termination of said flexible circuitry to maintain pressure upon said electrical conductors when said electrical conductors are surface mounted.

6. A connector as in claim 4 wherein said electrical conductors terminate outside and away from said biasing member.

7. A connector as in claim 1 wherein each set of parallel-spaced conductors terminates at one end of each set thereof in a first and a second matrix of electrical contacts.

8. A connector as in claim 1 wherein said electrical conductors are co-planar.

9. A connector as in claim 1 wherein said flexible circuitry includes a ground plane defining micro-strip flexible circuitry.

10. A connector as in claim 1 wherein said flexible circuitry includes a ground plane and wherein said electrical conductors are alternatively grounded to said ground plane defining co-planar with ground plane flexible circuitry.

11. A connector as in claim 1 including a cam member mounted within said biasing member, rotation of said biasing member relative to said cam member spreading the arm portions of said biasing member for insertion of a circuit board therebetween.

12. A connector as in claim 11 wherein said electrical conductor of said flexible circuitry terminates outside and adjacent said generally planar center portion of said biasing member, said connector being surface-mountable.

13. A connector as in claim 11 further including resilient means between said planar center portion of said biasing means and the termination of said flexible circuitry to maintain pressure upon said electrical conductors when said electrical conductors are surface mounted.

14. A connector as in claim 11 wherein said electrical conductors terminate outside and away from said biasing member.

15. A connector as in claim 11 wherein each set of parallel-spaced conductors terminates at one end of each set thereof in a first and a second matrix of electrical contacts.

16. A connector as in claim 11 wherein said electrical conductors are co-planar.

17. A connector as in claim 11 wherein said flexible circuitry includes a ground plane defining micro-strip flexible circuitry.

18. A connector as in claim 11 wherein said flexible circuitry includes a ground plane and wherein said electrical conductors are alternatively grounded to said ground plane defining co-planar with ground plane flexible circuitry.

* * * * *

UNITED STATES PATENT AND TRADEMARK OFFICE
CERTIFICATE OF CORRECTION

PATENT NO.   : 4,911,653
DATED        : March 27, 1990
INVENTOR(S)  : Alfred C. Walton and John F. Krumme It is certified that error appears in the above-identified patent and that said Letters Patent is hereby corrected as shown below:

Column 2, line 11, following "rotation" delete "o" and insert therefor --of--.

Column 6, line 34, delete "an" and insert therefor --and--.

Column 6, line 54, delete "no" and insert therefor --not--.

Signed and Sealed this

Twenty-eighth Day of May, 1991

Attest:

HARRY F. MANBECK, JR.

Attesting Officer

Commissioner of Patents and Trademarks